United States Patent [19]

Hashimoto

[11] Patent Number: 5,392,236
[45] Date of Patent: Feb. 21, 1995

[54] SEMICONDUCTOR MEMORY DEVICE

[75] Inventor: Kiyokazu Hashimoto, Tokyo, Japan

[73] Assignee: NEC Corporation, Tokyo, Japan

[21] Appl. No.: 84,022

[22] Filed: Jun. 30, 1993

[30] Foreign Application Priority Data

Jun. 30, 1992 [JP] Japan .................................. 4-196392

[51] Int. Cl.⁶ .............................................. G11C 11/34
[52] U.S. Cl. .................. 365/185; 365/189.01; 365/189.06
[58] Field of Search .................... 365/185, 900, 189.06, 365/189.01

[56] References Cited

U.S. PATENT DOCUMENTS

| | | | |
|---|---|---|---|
| 4,769,787 | 9/1988 | Furusawa et al. | 365/189.09 X |
| 5,262,984 | 11/1993 | Noguchi et al. | 365/185 |
| 5,265,062 | 11/1993 | Lee | 365/185 X |

*Primary Examiner*—Do Hyun Yoo

*Attorney, Agent, or Firm*—Sughrue, Mion, Zinn, Macpeak & Seas

[57] ABSTRACT

In a flash EEPROM, a write voltage setting circuit is configured to generate an output voltage having a positive temperature characteristics to a gate of a write control MOSFET. Thus, even if the current drive power of the write control MOSFET is decreased because the temperature elevation, the decrease of the current drive power is compensated for by the increased gate voltage of the write control MOSFET, and even if the current drive power of the write control MOSFET is increased because the temperature drop, the increase of the current drive power of the write control MOSFET is compensated for by the decreased gate voltage of the write control MOSFET. Thus, even if the temperature changes, the write voltage $V_D$ applied to a drain of a memory cell in the write mode can be maintained in a range near to a designed value, and accordingly, the temperature margin of the writing characteristics becomes larger.

4 Claims, 6 Drawing Sheets

SEMICONDUCTOR MEMORY DEVICE

BACKGROUND OF THE INVENTION

1. Field of the Invention

The present invention relates to a semiconductor device mainly composed of MOSFETs (metal-oxide-semiconductor field effect transistors), and more specifically to a semiconductor device including electrically writable non-volatile semiconductor memory such as EEPROM (electrically erasable program read only memory).

2. Description of Related Art

Conventionally, flash EEPROMs are basically constituted of a memory cell array, a sense amplifier connected to a common input node of the memory cell array, a data input buffer also connected to the common input node and a write voltage setting circuit connected to the data input buffer.

However, the write voltage setting circuit has been so configured that the higher the temperature becomes, the lower an output voltage of the write voltage setting circuit. In addition, the higher the temperature becomes, the larger the equivalent resistance of a writing MOSFET becomes. As a result, if the temperature becomes high, a write voltage applied to a drain of a memory cell to be written becomes low. This has caused the following disadvantages:

(1) The higher the temperature of the memory cell to be written becomes, the longer a necessary writing time becomes. This becomes a problem in the memory characteristics.

(2) On the other hand, if the temperature of the memory cell to be written becomes lower, an excessive stress is applied on non-selected memory cells connected to the digit line to which a selected memory cell to be written is connected, and the written memory cells are erroneously erased. This is a problem in a reliability.

Therefore, the conventional semiconductor memory device has only a small temperature margin of the writing characteristics.

SUMMARY OF THE INVENTION

Accordingly, it is an object of the present invention to provide a semiconductor memory device which has overcome the above mentioned defect of the conventional one.

Another object of the present invention is to provide a semiconductor memory device having an increased margin of the writing temperature characteristics.

The above and other objects of the present invention are achieved in accordance with the present invention by a semiconductor memory device comprising a plurality of electrically programmable memory cells having their drain connected in common to one digit line, a corresponding number of X-address lines connected to a gate of the plurality of electrically programmable memory cells, respectively, a Y-address selection MOSFET having its source connected to the digit line and its gate connected to a corresponding Y-address line, a sense amplifier connected to a drain of the Y-address selection MOSFET, a write control MOSFET having its source connected to the drain of the Y-address selection MOSFET and its drain connected to a write voltage supplying terminal, a data input buffer connected to a data input terminal and having a high voltage receiving terminal so as to supply a high voltage to a gate of the write control MOSFET in accordance with a signal supplied to the data input terminal, and a write voltage setting circuit having an output connected to the high voltage receiving terminal of the data input buffer, the write voltage setting circuit being configured to generate an output voltage having a positive temperature characteristics through the data input buffer to the gate of the write control MOSFET.

The above and other objects, features and advantages of the present invention will be apparent from the following description of preferred embodiments of the invention with reference to the accompanying drawings.

DESCRIPTION OF THE PREFERRED EMBODIMENTS

Figure 1:
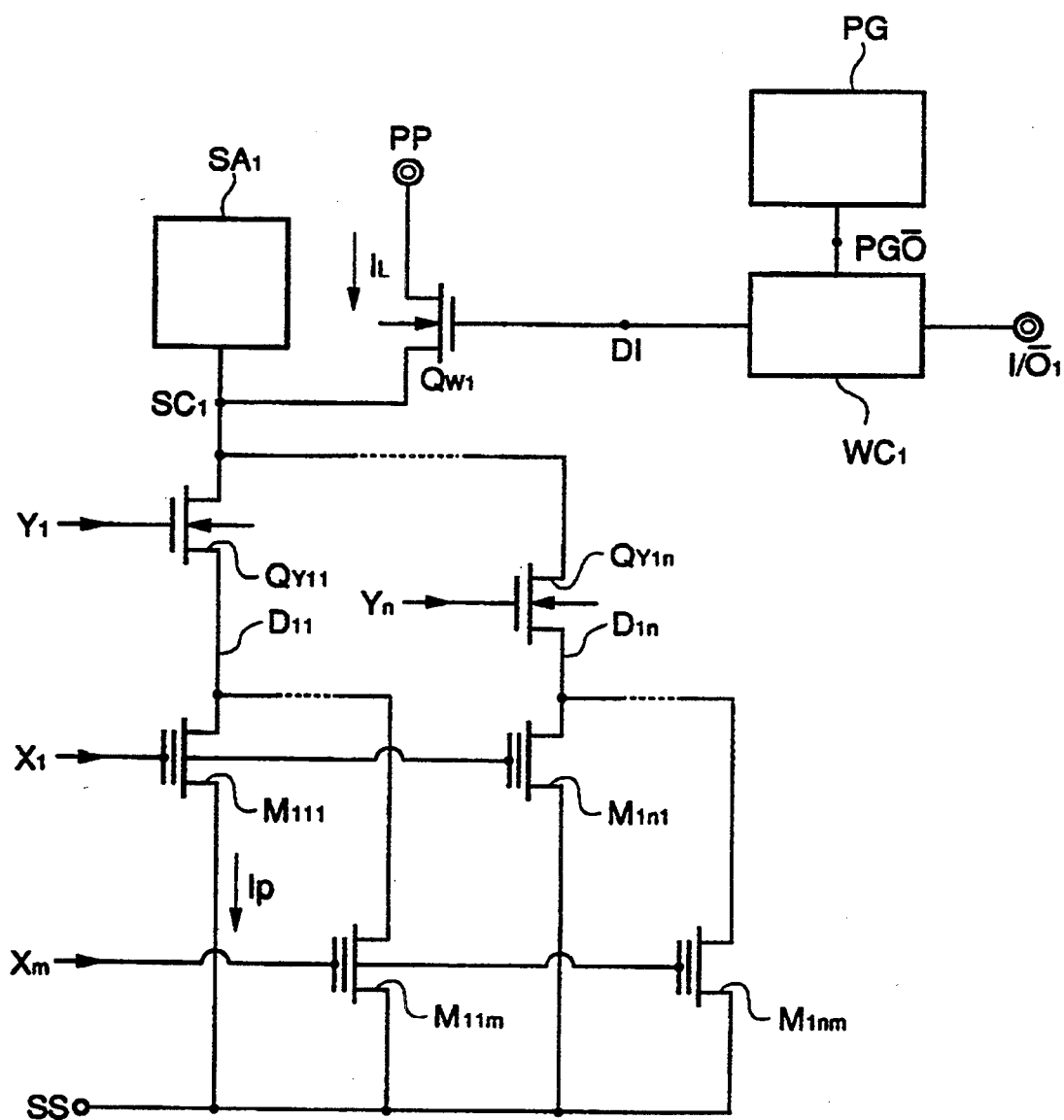
FIG. 1 is a block diagram of a part of a writing/reading control circuit in a flash EEPROM.

Referring to FIG. 1, there is shown a block diagram of a part of a writing/reading control circuit in a flash EEPROM.

Reference Sign PP designates an external voltage input terminal for receiving a high voltage $V_{pp}(=12.0$ V, for example) in a write mode, and Reference Sign $I/\overline{O}_1$ shows a data input/output terminal for receiving data to be written to a selected memory cell in the write mode and for outputting data read from a selected memory in a read mode.

In the shown circuit, the flash EEPROM includes a number of memory cells "n"×"m". Of the memory cells "n"×"m", memory cells $M_{111}$ to $M_{11m}$ are connected at their drain in common to a digit line $D_{11}$ so that the memory cells $M_{111}$ to $M_{11m}$ are connected in parallel to each other, and memory cells $M_{1n1}$ to $M_{1nm}$ are connected at their drain in common to a digit line $D_{1n}$ so that the memory cells $M_{1n1}$ to $M_{1nm}$ are connected in parallel to each other. All of the memory cells are connected at their source in common to a source terminal SS, which is applied with 0 V in the write mode and in the read mode. In addition, the memory cells $M_{111}$ to $M_{1n1}$ are connected at their gate in common to an X-address line $X_1$ of "m" X-address lines $X_1$ to $X_m$ which are used for designating an X address of a memory cell to be written or read. The memory cells $M_{11m}$ to $M_{1nm}$ are connected at their gate in common to an X-address line $X_m$ of the "m" X-address lines. In the write mode, $V_{PP}$ is applied to a selected one of the X-address lines $X_1$ to $X_m$, and 0 V is applied to the others or non-selected ones of the X-address lines $X_1$ to $X_m$.

The digit lines $D_{11}$ to $D_{1n}$ are connected through Y-select N-channel MOSFETs $Q_{Y11}$ to $Q_{Y1n}$, respectively, in common to an input/output node $SC_1$, which is in turn connected to a sense amplifier SA1 for reading the data from the selected memory cell. The Y-select MOSFETs $Q_{Y11}$ to $Q_{Y1n}$ are connected at their gate in common to "n" Y-address lines $Y_1$ to $Y_n$, respectively, which are used for designating a Y address of a memory cell to be written or read. In the write mode, Vpp is applied to a selected one of the Y-address lines $Y_1$ to $Y_n$, and 0 V is applied to the others or non-selected ones of the Y-address lines $Y_1$ to $Y_n$. The node $SC_1$ is also connected to a source of a write control N-channel MOSFET $Q_{w1}$, which is also connected at its drain to the external voltage input terminal PP. A gate of the write control MOSFET $Q_{w1}$ is connected to an output node DI of a data input buffer $WC_1$ so that a gate voltage of the write control MOSFET $Q_{w1}$ is controlled dependently upon whether or not the selected memory cell is to be written.

The data input buffer $WC_1$ is connected to the data input/output terminal $I/\overline{O}_1$, and also connected to an output node $\overline{PGO}$ of a writing voltage setting circuit PG so as to receive an output voltage $V_{PGO}$ from the writing voltage setting circuit PG. The data input buffer $WC_1$ is so configured that when a signal of "0" is applied to data input/output terminal $I/\overline{O}_1$, and in the write mode, the data input buffer $WC_1$ outputs the high voltage $V_{PGO}$ at the output node DI, and when a signal of "1" is applied to data input/output terminal $I/\overline{O}_1$, and when the memory is not in the write mode, the data input buffer $WC_1$ outputs 0 V at the output node DI. Thus, a voltage applied to the drain of the memory cells is controlled by the output voltage $V_{PGO}$ from the writing voltage setting circuit PG.

FIG. 1 shows only a part of the memory circuit relating to the data input/output terminal $I/\overline{O}_1$. An actual semiconductor device includes a plurality of data input/output terminals, for example, sixteen data input/output terminals $I/\overline{O}_1$ to $I/\overline{O}_{16}$. In this case, 16 circuits similar to a portion of the circuit shown in FIG. 1 excluding the writing voltage setting circuit PG are provided in parallel to each other. However, these circuits are omitted for simplification of the drawing.

In this specification, for simplification of description, N-channel enhancement MOSFETs (indicated as "NE-MOSFET hereinafter) have the same threshold "$V_{TN}$" and the substrate potential of NE-MOSFETs is connected to the ground level terminal. In addition, P-channel enhancement MOSFETs (indicated as "PE-MOSFET hereinafter) have the same threshold "$V_{TP}$" and the substrate potential of PE-MOSFETs is connected to the voltage supply terminal CC.

Figure 2:
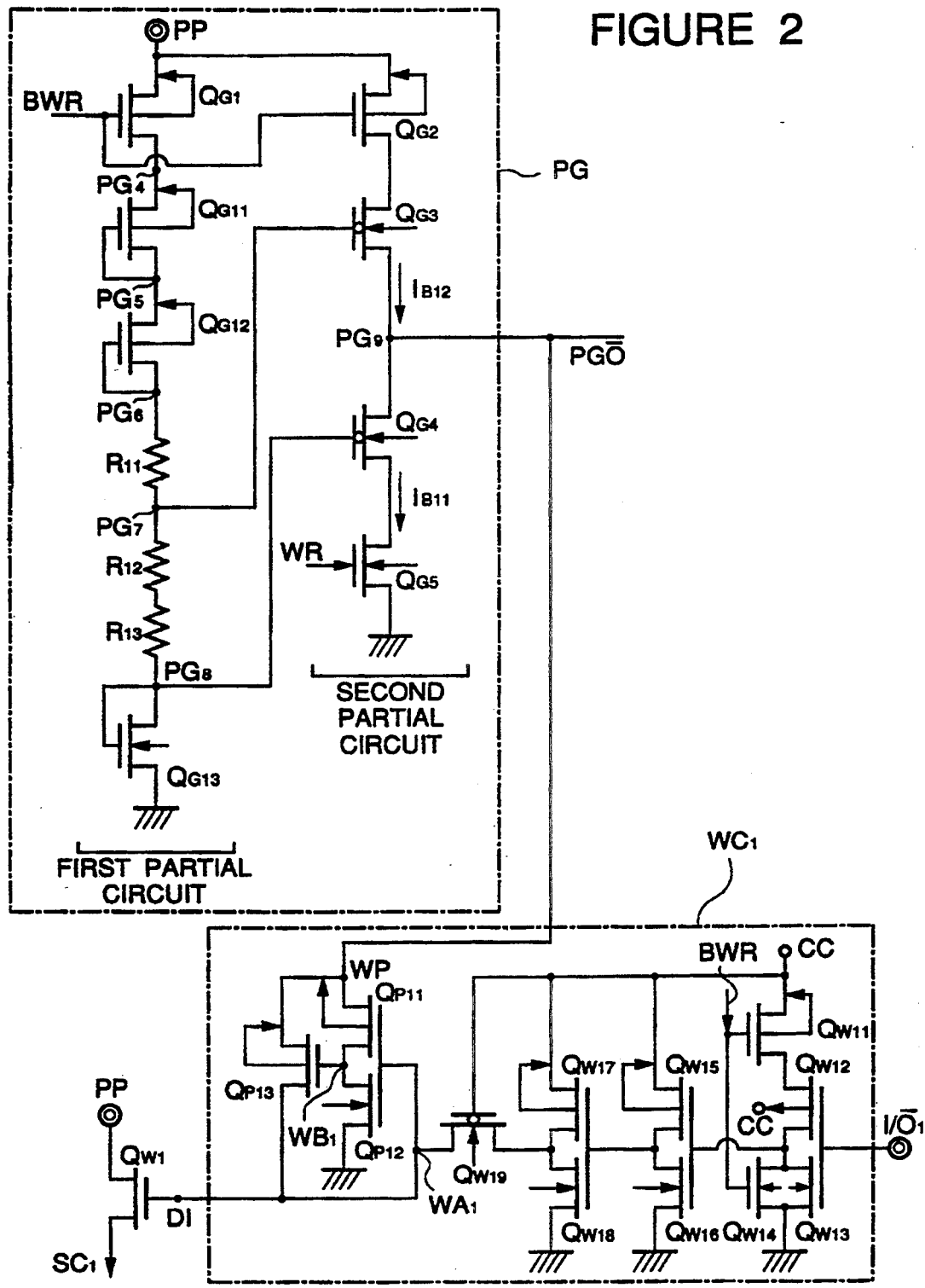
FIG. 2 is a block diagram of a first embodiment of the semiconductor memory device in accordance with the present invention.

Referring to FIG. 2, there is shown a circuit diagram of the data input buffer $WC_1$ and the writing voltage setting circuit PG in accordance with the present invention.

The shown data buffer $WC_1$ includes PE-MOSFETs $Q_{W11}$, $Q_{W12}$, $Q_{W15}$ and $Q_{W17}$, NE-MOSFETs $Q_{W13}$, $Q_{W14}$, $Q_{W16}$ and $Q_{W18}$, an N-channel MOSFET $Q_{W19}$ having a substrate threshold lower than the threshold of the NE-MOSFETs, PE-MOSFETs $Q_{P11}$ and $Q_{P13}$ having their substrate connected to the voltage supply terminal PP, and an NE-MOSFET $Q_{P12}$, which are connected as shown in FIG. 2. The N-channel MOSFET having a substrate threshold lower than the threshold of the NE-MOSFETs will be indicated as "E0-MOSFET" hereinafter.

Specifically, a source of NE-MOSFETs $Q_{W13}$, $Q_{W14}$, $Q_{W16}$ and $Q_{W18}$ are connected to the ground, and a gate of PE-MOSFET $Q_{W12}$ and NE-MOSFET $Q_{W13}$ are connected in common to the data input/output terminal $I/\overline{O}_1$. A drain of NE-MOSFETs $Q_{W13}$ and $Q_{W14}$ are connected to a drain of PE-MOSFET $Q_{W12}$ and also in common to a gate of PE-MOSFET $Q_{W15}$ and NE-MOSFET $Q_{W16}$. A source of PE-MOSFET $Q_{W12}$ is connected to a drain of PE-MOSFET $Q_{W11}$, and source of PE-MOSFET $Q_{W11}$ is connected to the voltage supply terminal CC. A gate of NE-MOSFET $Q_{W14}$ and a gate of PE-MOSFET $Q_{W11}$ are connected in common to a signal line BWR which will be explained hereinafter.

A drain of NE-MOSFET $Q_{W16}$ is connected to a drain of PE-MOSFET $Q_{W15}$ and also in common to a gate of PE-MOSFETs $Q_{W17}$ and NE-MOSFET $Q_{W18}$. A source of PE-MOSFET $Q_{W15}$ is connected to the voltage supply terminal CC. A drain of NE-MOSFET $Q_{W18}$ is connected to a drain of PE-MOSFET $Q_{W17}$, and also in common to one end of E0-MOSFET $Q_{W19}$. A source of PE-MOSFET $Q_{W17}$ and a gate of E0-MOSFET $Q_{W19}$ are connected to the voltage supply terminal CC.

The other end of E0-MOSFET $Q_{W19}$ is connected to a node $WA_1$ which is in turn connected in common to a gate of PE-MOSFETs $Q_{P11}$ and NE-MOSFET $Q_{P12}$. A source of NE-MOSFET $Q_{P12}$ is connected to the ground, and a drain of NE-MOSFET $Q_{P12}$ and a drain of PE-MOSFET $Q_{P11}$ is connected to a node $WB_1$, which is connected to a gate of PE-MOSFET $Q_{P13}$. A drain of PE-MOSFET $Q_{P13}$ is connected to the node $WA_1$. A substrate and a source of PE-MOSFET $Q_{P13}$ is connected to a node WP, which is also connected to a substrate and a source of PE-MOSFET $Q_{P11}$. This node WP is connected to the output terminal $\overline{PGO}$ of the write voltage setting circuit PG, and the node $WA_1$ is connected to the output node DI of the data input buffer.

On the other hand, the write voltage setting circuit PG includes PE-MOSFETs $Q_{G1}$ and $Q_{G2}$ having their substrate and source connected to the voltage supply terminal PP. A gate of PE-MOSFETs $Q_{G1}$ and $Q_{G2}$ are connected in common to the control signal line BWR which is applied with 0 V in the write mode and with $V_{PP}$ in the other modes. A drain of PE-MOSFET $Q_{G2}$ is connected through E0-MOSFET $Q_{G3}$ to a node $PG_9$, which is connected to the output terminal $\overline{PGO}$. The node $PG_9$ is also connected through another E0-MOSFET $Q_{G4}$ to a drain of NE-MOSFET $Q_{G5}$. A source of NE-MOSFET $Q_{G5}$ is connected to the ground, and a gate of NE-MOSFET $Q_{G5}$ is connected to another control signal line WR which is in an inverted relation to the control signal line BWR. Therefore, the control signal line WR is applied with $V_{PP}$ in the write mode and with 0 V in the other modes.

A drain of PE-MOSFET $Q_{G1}$ is connected to a node $PG_4$, which is connected to a source and a substrate of PE-MOSFET $Q_{G11}$. A drain and a gate of PE-MOSFET $Q_{G11}$ are connected to a node $PG_5$, which is connected to a source and a substrate of PE-MOSFET $Q_{G12}$. A drain and a gate of PE-MOSFET $Q_{G12}$ are connected to a node PG$_6$, which is connected to a node PG$_8$ through series-connected resistors R$_{11}$, R$_{12}$ and R$_{13}$ having a resistance r$_{11}$, r$_{12}$ and r$_{13}$, respectively. The node PG$_8$ is connected to a gate and a drain of NE-MOSFET Q$_{G13}$, which has its source connected to the ground. A connected node PG$_7$ between the resistors R$_{11}$ and R$_{12}$ is connected to a gate of E0-MOSFET Q$_{G3}$, and the node PG$_8$ is connected to a gate of E0-MOSFET Q$_{G4}$. The series-connected resistors R$_{11}$, R$_{12}$ and R$_{13}$ constitute a voltage divider for dividing a voltage difference between the node PG$_6$ and the node PG$_8$.

Here, a circuit constituted of PE-MOSFETs Q$_{G1}$, Q$_{G11}$ and Q$_{G12}$, the resistors R$_{11}$, R$_{12}$ and R$_{13}$ and NE-MOSFET Q$_{G13}$ is called a first partial circuit, and a circuit constitute of PE-MOSFET Q$_{G2}$, E0-MOSFETs Q$_{G3}$ and Q$_{G4}$ and, NE-MOSFET Q$_{G5}$ is called a second partial circuit.

Now, operation of the memory circuit explained just above will be described with reference to FIGS. 1 and 2 under assumption that the memory cell M$_{111}$ is selected in the write mode.

In the write mode, V$_{PP}$ is applied to the signal line WR and 0 V is applied to the signal line BWR. Therefore, MOSFETs Q$_{G1}$, Q$_{G2}$ and Q$_{G5}$ are turned on. In this embodiment, MOSFETs Q$_{G1}$, Q$_{G4}$, Q$_{G5}$ and Q$_{G13}$ are configured to have a current drive power sufficiently larger than a composite resistance r$_{11}$+r$_{12}$+r$_{13}$ of the resistors R$_{11}$, R$_{12}$ and R$_{13}$. Accordingly, a voltage V$_{PG6}$ of the node PG$_6$, a voltage V$_{PG8}$ of the node PG$_8$, and a voltage V$_{PG7}$ of the node PG$_7$ are expressed as follows:

$$V_{PG6} = V_{PP} - 2|V_{TP}| \quad (1)$$

$$V_{PG8} = V_{TN} \quad (2)$$

$$V_{PG7} = \{r_{11} \cdot V_{TN} + (r_{12}+r_{13})(V_{PP}-2|V_{TP}|)/(r_{11}+r_{12}+r_{13})\} \quad (3)$$

Here, assuming that it is designed that the current drive power of MOSFET Q$_{G3}$ is sufficiently larger than that of MOSFET Q$_{G4}$ and the threshold of E0-MOSFET is V$_{TO}$, a voltage V$_{PG9}$ of the node PG$_9$ is expressed as follows:

$$\begin{aligned}V_{PG9} &\approx V_{PG7} - V_{TO} - \alpha \\ &\approx \{r_{11} \cdot V_{TN} + (r_{12}+r_{13})(V_{PP} - \\ &\quad 2|V_{TP}|)/(r_{11}+r_{12}+r_{13})\} - V_{TO} - \alpha\end{aligned} \quad (4)$$

where $\alpha$ is voltage drop caused by the current flowing through MOSFET Q$_{G4}$.

For example, if it is so designed that V$_{PP}$=12 V, r$_{11}$=10 KΩ, and r$_{12}$+r$_{13}$=80 KΩ and if it is assumed that V$_{TN}$=1.0 V, V$_{TP}$=−1.0 V, V$_{TO}$=0.5 V, and $\alpha$=0.12 V, it is obtained that V$_{PG9}$≈8.38 V.

At this time, if "0" is applied to the data input/output terminal I/O$_1$, the node WA$_1$ is first charged to (V$_{CC}$−V$_{T0}$). Therefore, the node WB$_1$ is brought to 0 V by action of an inverter constituted of MOSFETs Q$_{P11}$ and Q$_{P12}$, so that MOSFETs Q$_{P13}$ is turned on. Accordingly, the node WA$_1$ is elevated from (V$_{CC}$−V$_{T0}$) to a value expressed by the equation (4). Namely, a voltage V$_{DI}$ of the output node DI of the data input buffer WC$_1$ is expressed as follows:

$$\begin{aligned}V_{DI} &= V_{PG0} \\ &= V_{PG9} \\ &\approx \{r_{11} \cdot V_{TN} + (r_{12}+r_{13})(V_{PP} - \\ &\quad 2|V_{TP}|)/(r_{11}+r_{12}+r_{13})\} - V_{TO} - \alpha\end{aligned} \quad (5)$$

Thus, MSOFET Q$_{W1}$ in FIG. 1 is turned on. At this time, V$_{PP}$ is applied to the Y-address line Y$_1$ and 0 V is applied to the other Y-address lines, and V$_{PP}$ is applied to the X-address line X$_1$ and 0 V is applied to the other X-address lines, so that MOSFET Q$_{Y11}$ and the memory cell M$_{111}$ are turned on. A voltage of the digit line D$_{11}$ is balanced at a value where the current drive power of MOSFET Q$_{W1}$ becomes consistent with that of the memory cell M$_{111}$.

This value is ordinarily designed to be larger than a writing starting voltage of the memory cell, and therefore, the memory cell M$_{111}$ is written.

On the other hand, if "1" is applied to the data input/output terminal I/O$_1$, the node WA$_1$ is discharged to 0 V, and therefore, MOSFET Q$_{P11}$ is turned on and MOSFET Q$_{P12}$ is turned off, so that MOSFETs Q$_{P13}$ is turned off. Accordingly, the node WA$_1$ is maintained at 0 V. Namely, the write control MOSFET Q$_{W1}$ is in a non-conductive condition, and therefore, the high voltage is not applied to the digit line D$_{11}$, and so, the memory cell M$_{111}$ is not written.

Next, with reference to FIGS. 3 to 5, there will be described the change of the output voltage V$_{PGO}$ of the write voltage setting circuit PG and the change of the voltage V$_{D11}$ of the digit line D$_{11}$ in the writing mode which are caused by the temperature change.

Figure 3:
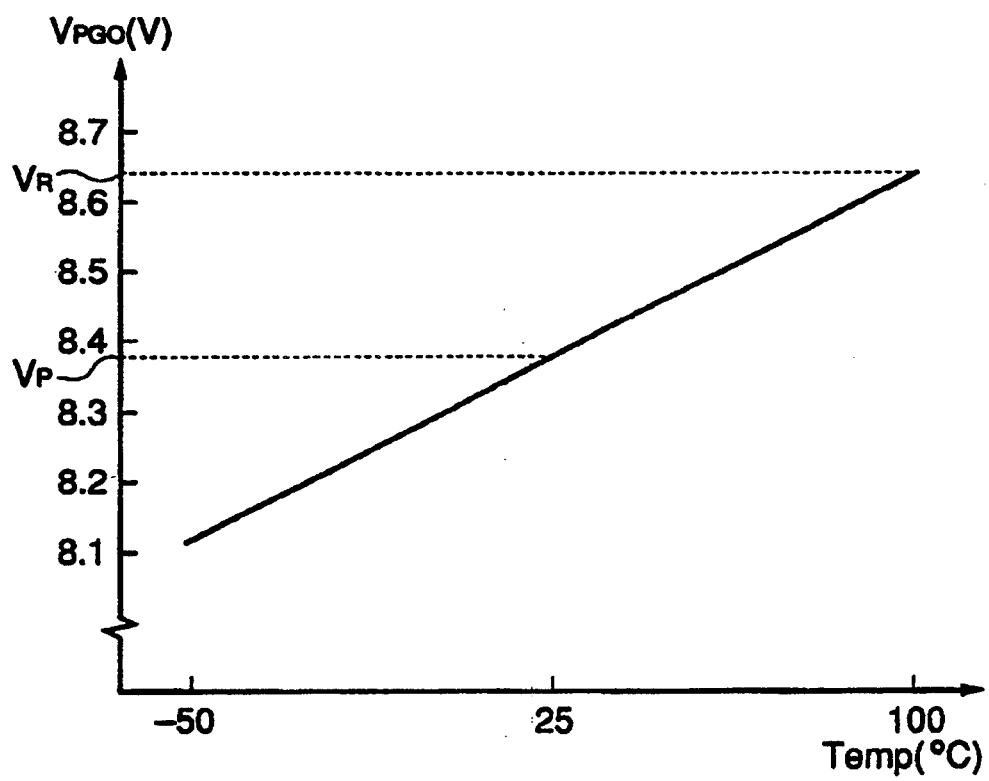
FIG. 3 is a graph showing a temperature dependency of the output voltage of the write voltage setting circuit in the semiconductor memory device shown in FIG. 2.
Figure 4:
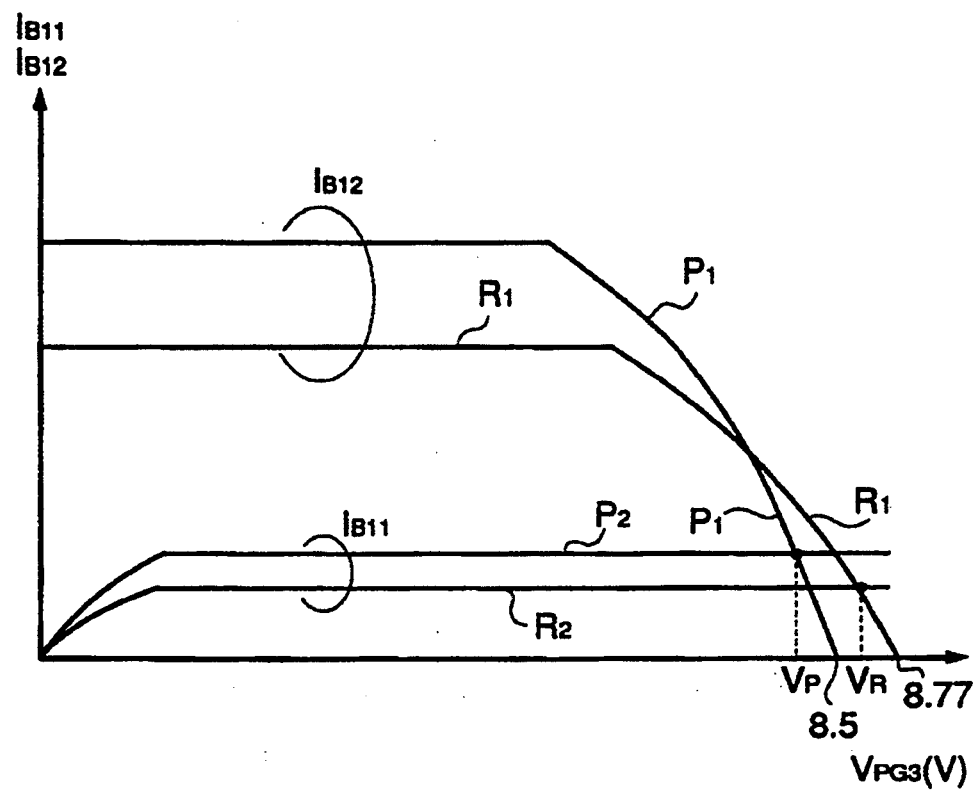
FIG. 4 is a graph showing a current-voltage characteristics of MOSFETs used in the write voltage setting circuit in the semiconductor memory device shown in FIG. 2.

FIG. 3 is a graph showing the change of the output voltage V$_{PGO}$ of the write voltage setting circuit PG occurring when the temperature changes, and FIG. 4 is a graph showing the change of a current-voltage characteristics of MOSFETs Q$_{G3}$ and Q$_{G4}$ used in the write voltage setting circuit PG. In FIG. 4, the curves P1 and P2 show the current-voltage characteristics of MOSFETs Q$_{G3}$ and Q$_{G4}$ at the temperature of 25° C., respectively, and the curves R1 and R2 show the current-voltage characteristics of MOSFETs Q$_{G3}$ and Q$_{G4}$ at the temperature of 100° C., respectively.

Figure 5:
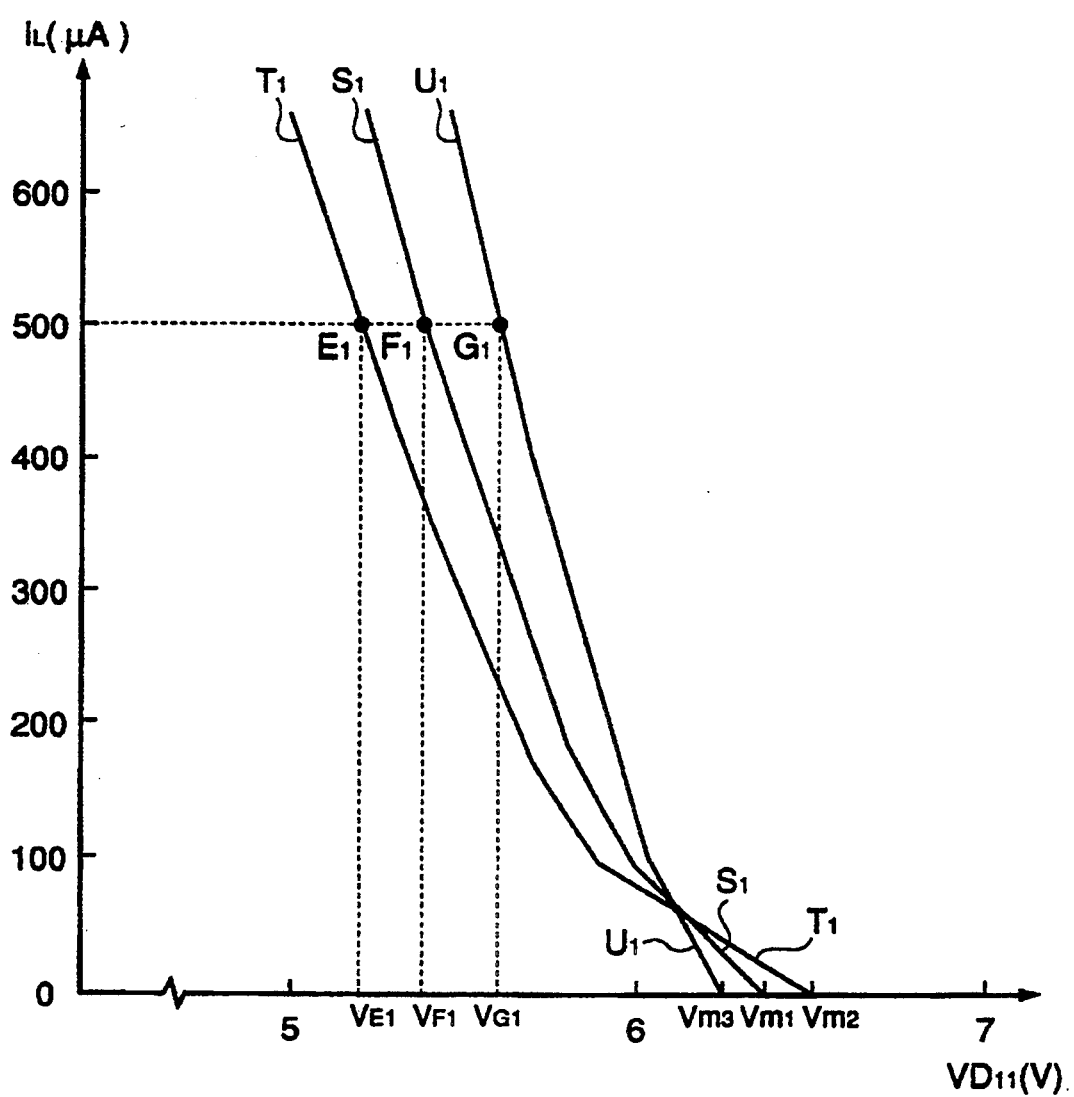
FIG. 5 is a graph showing a temperature dependency of a write load characteristics of the write control MOSFET and the Y-select MOSFET in the first embodiment.

FIG. 5 is a graph showing a write load characteristics determined by the current drive power of the write control MOSFET Q$_{W1}$ and the Y-select MOSFET Q$_{Y11}$ when the voltage V$_{D11}$ of the digit line D$_{11}$ changes in the first embodiment shown in FIG. 1. The curve S1 shows the characteristics at the temperature of 25° C., and the curve T1 indicates the characteristics at the temperature of 100° C. In addition, the curve U1 indicates the characteristics at the temperature of −50° C.

As mentioned hereinbefore, the voltage V$_{PG7}$ of the node P$_{G7}$ in the write voltage setting circuit PG is expressed by the equation (3), and the voltage V$_{PGO}$ of the output node PG0 is expressed by the equation (5). The equation (3) includes items V$_{TN}$ and V$_{TP}$ which change with the temperature change.

In general, if the temperature elevates, the thresholds V$_{TN}$ and |V$_{TP}$| drop. V$_{TN}$ and V$_{TP}$ are generally expressed as follows:

$$V_{TP} = V_{FBN} + 2\phi_{Fn} - \{2K_{s}\epsilon_{0q} N_D|(2\phi_{Fn})|\}^{\frac{1}{2}}/C_{ox} \quad (6)$$

$$V_{TN} = V_{FBP} + 2\phi_{Fp} + \{2K_{s}\epsilon_{0q} N_A(2\phi_{Fp})\}^{\frac{1}{2}}/C_{ox} \quad (7)$$

where $V_{FBN}$ is the flat-band voltage of an N-type semiconductor of a substrate.

$\phi_{Fn}$ is the Fermi level of an N-type semiconductor of a substrate.

$N_D$ is a donor concentration of an N-type semiconductor of a substrate.

$C_{ox}$ is a gate capacitance.

Ks is a dielectric constant $\epsilon_0$ is the dielectric of vacuum ($=8.854\times10^{-22}$ F/m).

$V_{FBP}$ is the flat-band voltage of a P-type semiconductor of a substrate.

$\phi_{Fp}$ is the Fermi level of a P-type semiconductor of a substrate $N_A$ is an accepter concentration of a P-type semiconductor of a substrate.

In the above equations, the value of $|\phi_{Fn}|$ and $\phi_{Fp}$ become large if the temperature elevates, and therefore, the thresholds $V_{TN}$ and $|V_{TP}|$ drop with elevation of the temperature.

Accordingly, as shown in FIG. 3, when the memory cell is to be written, the gate voltage $V_{PGO}$ of the write control MOSFET $Q_{W1}$ becomes high if the temperature becomes high. For example, as mentioned hereinbefore, it is assumed that $V_{PP}=12$ V, $r_{11}=10$ K$\Omega$, and $r_{12}+r_{13}=80$ K$\Omega$ and also it is assumed that $V_{TN}=1.0$ V, $V_{TP}=1.0$ V, $V_{T0}=0.5$ V, and $\alpha=0.12$ V, and also $|V_{TP}|$, $V_{TN}$ and $V_{T0}$ have the temperature characteristics of $-0.1$ V/75° C. so that the value drops by 0.1 V if the temperature elevates by 75° C. Under this assumption, if $V_{PGO}=V_{PG9}\approx8.38$ V at the temperature of 25° C., when the temperature is at 100° C., $V_{PGO}=V_{PG9}\approx8.65$ V, and when the temperature is at $-50°$ C., $V_{PGO}=V_{PG9}\approx8.11$ V. In FIG. 3, the value of $V_{PGO}$ at the temperature of 25° C. is designated with Reference Sign "$V_R$", and the value of $V_{PGO}$ at the temperature of 100° C. is indicated by Reference Sign "$V_P$".

As mentioned hereinbefore, FIG. 4 is a graph showing the current-voltage characteristics of MOSFETs $Q_{G3}$ and $Q_{G4}$ when the voltage $V_{PG9}$ of the node $P_{G9}$ changes. The curves P1 and P2 show the current-voltage characteristics of MOSFETs $Q_{G3}$ and $Q_{G4}$ at the temperature of 25° C., respectively. Now, assuming that the temperature elevates to 100° C., the gate voltage $V_{PG7}$ of the MOSFET $Q_{G3}$ elevates from 9 V to 9.17 V, as will be understood from the equation (3). Accordingly, the maximum potential, to which the node $P_{G9}$ can attain, becomes higher than the case of the temperature 25° C., as shown by the curve R1. Thereafter, the current $I_{B11}$ flowing through MOSFET $Q_{G3}$ becomes large with the drop of $V_{PG9}$, and MOSFET $Q_{G3}$ starts to operate in a saturated region, the current $I_{B11}$ is balanced at a constant value ($I_{S2}$). The higher the temperature becomes, the mobility of MOSFETs drops, but the threshold also drops. Accordingly, the current drive power of MOSFET is determined by a difference between the drop of the mobility and the drop of the threshold. In this connection, it can be generally said that the higher the temperature becomes, the lower the current drive power becomes.

Accordingly, as shown in FIG. 4, it becomes $I_{S1}>I_{S2}$. Similarly, the value of the node $P_{G8}$ drops from 0.5 V to 0.4 V as will be understood from the equation (2). Therefore, as shown in the curve R2 in FIG. 4, the current drive power of MOSFET $Q_{G4}$ becomes small in comparison with the case of the temperature 25° C. At this time, the voltage of the node $P_{G9}$ is expressed by an X coordinate of an intersecting point between the curves R1 and R2, and is indicated by $V_R$ in FIG. 4.

Thus, as shown from FIG. 3, the higher the temperature becomes, the higher the output voltage $V_{PGO}$ of the writing voltage setting circuit PG becomes.

In addition, it will be noted from FIG. 3 that the embodiment of the output voltage $V_{PGO}$ of the writing voltage setting circuit has a positive temperature characteristics. To the contrary, an output voltage of the writing voltage setting circuit in the prior art had a negative temperature characteristics. Accordingly, the decrease of the current drive power of the write control MOSFET $Q_{W1}$ caused with the temperature elevation is compensated for by increasing the gate voltage $V_{DI}$, and the increase of the current drive power of the write control MOSFET $Q_{W1}$ caused with the temperature drop is compensated for by decreasing the gate voltage $V_{DI}$. Thus, the temperature dependency of the write voltage $V_D$ on the digit line can be made smaller than the conventional example.

As mentioned hereinbefore, FIG. 5 shows the write load characteristics determined by the current drive power of the write control MOSFET $Q_{W1}$ and the Y-select MOSFET $Q_{Y11}$. The curve S1 shows the characteristics at the temperature of 25° C., and the curve T1 indicates the characteristics at the temperature of 100° C. As mentioned above, the gate voltage of the node $\overline{PGO}$ at the temperature of 100° C., namely, the gate voltage of MOSFET $Q_{W1}$ at the temperature of 100° C. is higher than that at the temperature of 25° C. Therefore, a voltage $V_{on2}$, at which a current starts to flow in the course of decreasing the voltage $V_{D11}$ applied to the digit line $D_{11}$ at the temperature of 100° C., becomes higher than a voltage $V_{on1}$ at the temperature of 25° C.

Furthermore, with the decrease of the voltage $V_{D11}$ applied to the digit line $D_{11}$, the current increases, but the inclination of this current increase is gentle or slow in comparison with the case of the temperature of 25° C. This is attributable to the fact that the higher the temperature becomes, the current drive power of the MOSFET $Q_{W1}$ drops.

On the other hand, in FIG. 5 the curve U1 indicates the write load characteristics at the temperature of $-50°$ C. As mentioned above, the gate voltage of the node $\overline{PGO}$ at the temperature of $-50°$ C., namely, the gate voltage of MOSFET $Q_{W1}$ at the temperature of $-50°$ C. is lower than that at the temperature of 25° C. Therefore, a voltage $V_{on3}$, at which a current starts to flow in the course of decreasing the voltage $V_{D11}$ applied to the digit line $D_{11}$ at the temperature of $-50°$ C., becomes lower than the voltage $V_{on1}$ at the temperature of 25° C.

Furthermore, with the decrease of the voltage $V_{D11}$ applied to the digit line $D_{11}$, the current increases, and the inclination of this current increase is steep or rapid in comparison with the case of the temperature of 25° C. This is attributable to the fact that the lower the temperature becomes, the current drive power of the MOSFET $Q_{W1}$ increases.

Here, assuming that a write current IP=500 $\mu$A in the case of writing the memory cell $M_{111}$, the write current IP of the shown embodiment can be balanced at a point F1 in the case of the temperature of 25° C., and at a point E1 in the case of the temperature of 100° C. The write current IP can be balanced at a point G1 in the case of the temperature of $-50°$ C.

At these times, the voltage of the digit line $D_{11}$ is designated by Reference Signs $V_{F1}$, $V_{E1}$ and $V_{G1}$, respectively. In FIG. 5, it will be noted that $V_{F1}=5.42$ V, $V_{E1}=5.22$ V and $V_{G1}=5.62$ V. In this embodiment, accordingly, even if the temperature changes within a range of $\pm 75°$ C. from 25° C. (25° C.$\pm 75°$ C.) the value of the write voltage $V_D$ changes only within the range of 5.42 V$\pm 0.2$ V, which is remarkably smaller than the amount of change in the prior art.

Figure 6:
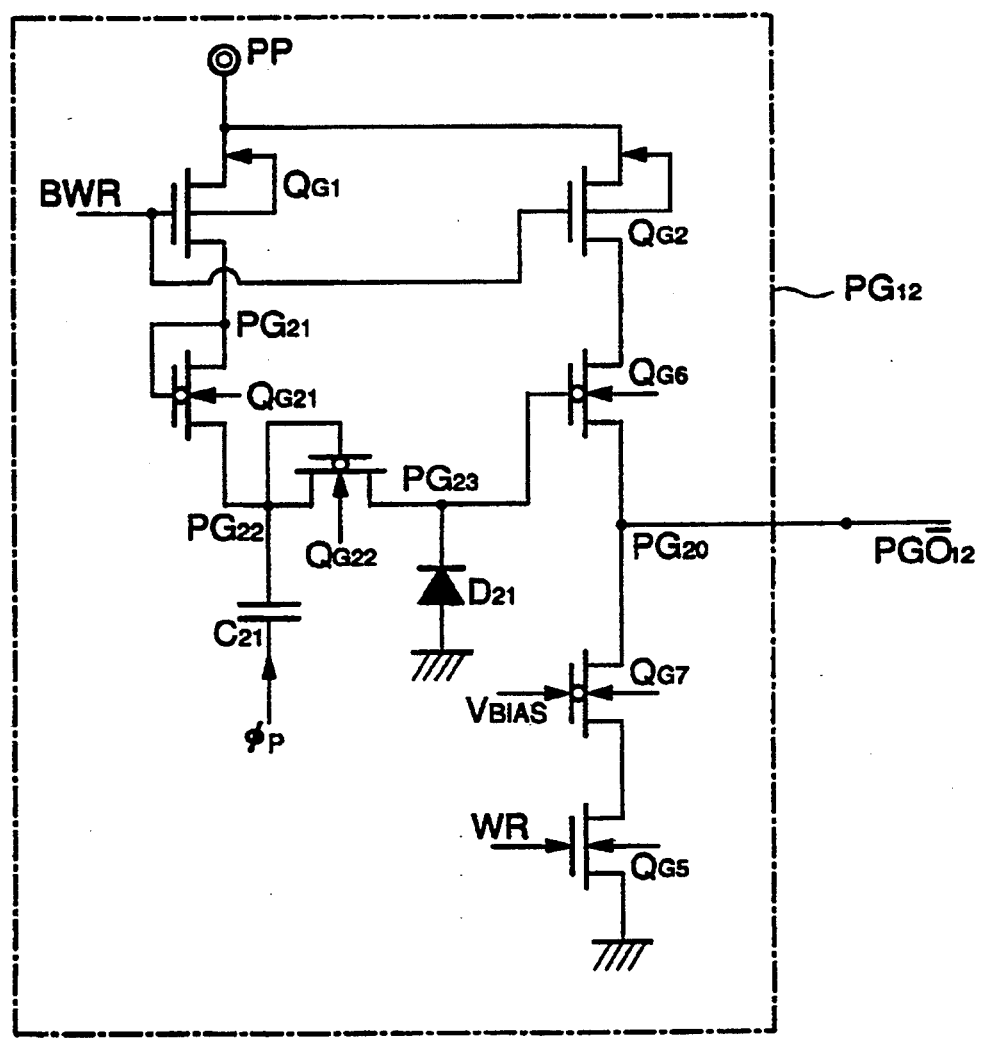
FIG. 6 is a block diagram of the write voltage setting circuit of a second embodiment of the semiconductor memory device in accordance with the present invention.

Referring to FIG. 6, there is shown a block diagram of the write voltage setting circuit of a second embodiment of the semiconductor memory device in accordance with the present invention. In FIG. 6, elements similar to those shown in FIG. 2 are given the same Reference Signs, and explanation thereof will be omitted for simplification of description.

In the write voltage setting circuit $PG_{12}$ shown in FIG. 6, a charge pump circuit is constituted of E0-MOSFETs $QG_{21}$ and $QG_{22}$ and a MOS capacitor $C_{21}$, and E0-MOSFETs $QG_6$ and $QG_7$ are provided in place of MOSFETs $QG_3$ and $QG_4$ in the circuit shown in FIG. 2.

A drain and a gate of MOSFET $QG_{21}$ are connected in common to a node $PG_{21}$, which is connected to the drain of MOSFET $QG_1$. A source of MOSFET $QG_{21}$ is connected to a node $PG_{22}$, which is connected to both of a drain and a gate of MOSFET $QG_{22}$. The node node $PG_{22}$ is also connected to one end of the capacitor $C_{21}$, and the other end of the capacitor $C_{21}$ is connected to a clock signal line $\phi_P$ supplied with a clock having some frequency and an amplitude changing between $0-V$ and $V_{PP}$ in the write mode.

A source of MOSFET $QG_{22}$ is connected to a node $PG_{23}$, which is connected to a cathode of a diode D1 having its anode connected to the ground. For example, this diode D21 is constituted of a P-type semiconductor substrate and an N-type diffusion layer formed in the P-type semiconductor substrate, and has a reverse direction break-down voltage $BV_J$. The diode D21 operates to clamp a voltage of the node $PG_{23}$ to the breakdown voltage $BV_J$ in the write mode.

A drain of MOSFET $QG_6$ is connected to the source of MOSFET $QG_2$ and a gate of MOSFET $QG_6$ is connected to the node $PG_{23}$. A source of MOSFET $QG_6$ is connected to an output node $PG_{20}$, which is connected to a drain of MOSFET $QG_7$. A gate of MOSFET $QG_7$ is connected to receive a constant voltage $V_{BIAS}$, and a source of MOSFET $QG_7$ is connected to a drain of MOSFET $QG_5$. The output node $PG_{20}$ is connected to an output terminal $\overline{PGO}_{12}$, which is connected to the node WP of the data input buffer shown in FIG. 2.

Figure 7:
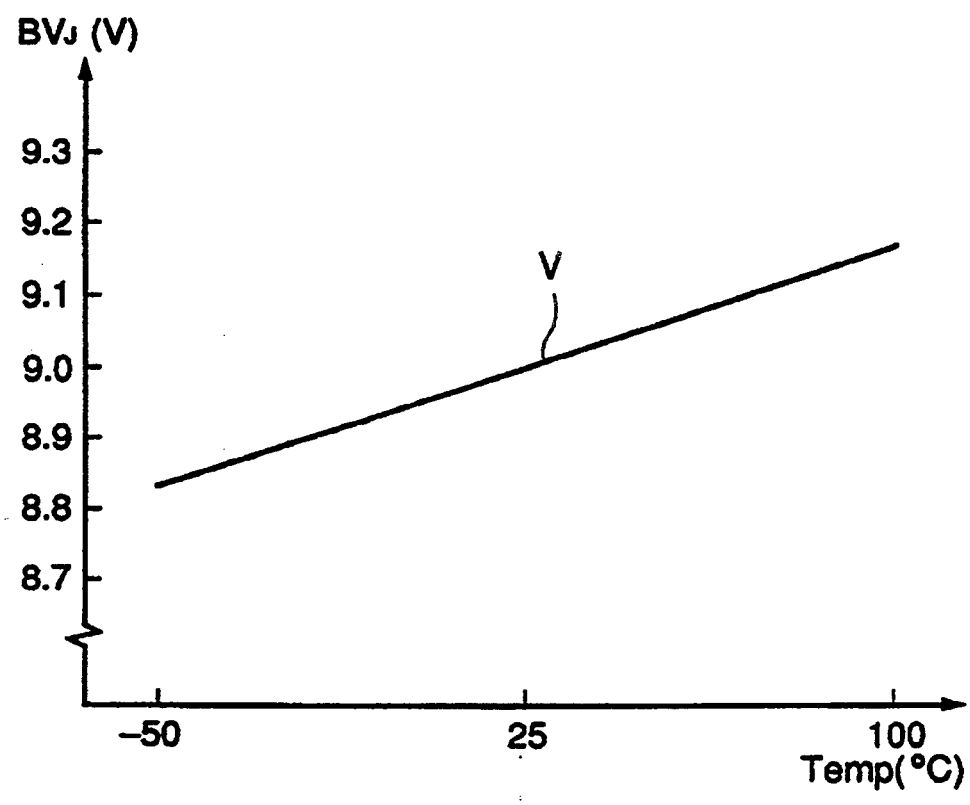
FIG. 7 is a graph showing a temperature dependency of the reverse direction breakdown voltage of the diode used in the write voltage setting circuit shown in FIG. 6.

Operation in the write mode of the write voltage setting circuit $PG_{12}$ in the second embodiment and a temperature dependency of the voltage $V_{PGO12}$ of the output terminal $\overline{PGO}_{12}$ with reference to FIGS. 6 and 7. FIG. 7 is a graph showing a temperature dependency of the reverse direction breakdown voltage $BV_J$ of the diode $D_{21}$ used in the write voltage setting circuit $PG_{12}$.

In the write mode, all of MOSFETs $Q_{G1}$, $Q_{G2}$ and $Q_{G5}$ are turned on, and the clock signal varying between 0 V and $V_{PP}$ is applied to the clock signal line $\phi_P$, so that the charge pump circuit constituted of MOSFETs $QG_{21}$ and $QG_{22}$ and the MOS capacitor $C_{21}$ is activated. Therefore, electric charges are successively supplied to the node $PG_{23}$, so that the voltage of the node $PG_{23}$, namely, the gate voltage of the MOSFET $QG_6$ gradually elevates, and the voltage of the node $PG_{20}$ correspondingly elevates.

If the voltage of the node $PG_{23}$ elevates and reaches the reverse direction breakdown voltage $BV_J$ of the diode $D_{21}$, the voltage of the node $PG_{23}$ is clamped to the reverse direction breakdown voltage $BV_J$. As a result, the voltage $V_{PG20}$ of the node $PG_{20}$ is balanced at the value expressed by the following equation:

$$V_{PG20} = V_{PG23} - V_{T0} - \beta = = BV_J - V_{T0} - \beta \quad (8)$$

where $\beta$ is voltage drop caused by the current flowing through MOSFET $Q_{G7}$.

For example, assuming that it is designed that at the temperature of 25° C., $BV_J = 9$ V, $V_{T0} = 0.5$ V and $\beta = 0.12$ V, the output voltage $V_{PG20}$ becomes the same value as $V_{PG9}$ in the first embodiment. Namely, $V_{PG20} \approx 8.38$ V. Accordingly, if "0" is applied to the input/output terminal $I/\overline{O}_1$, $V_{PG20}$ is applied to the gate of MOSFET $Q_{W1}$, similarly to the first embodiment, and therefore, the memory cell $M_{111}$ is written. The writing load characteristics in this case is the same as that shown by the curve $S_1$ in FIG. 5. On the other hand, the temperature characteristics of $BV_J$ is a positive characteristics as shown in FIG. 7.

Accordingly, when the temperature changes from 25° C. to 100° C., the value of $V_{PG20}$ elevates in accordance with the equation (8). Therefore, in the second embodiment, a voltage $V_{on2}$, at which a current starts to flow in the course of decreasing the voltage $V_{D11}$ applied to the digit line $D_{11}$ at the temperature of 100° C., becomes higher than a voltage $V_{on1}$ at the temperature of 25° C.

Similarly, when the temperature changes from 25° C. to $-50°$ C., the value of $V_{PG20}$ drops in accordance with the equation (8). Therefore, a voltage $V_{on3}$, at which a current starts to flow in the course of decreasing the voltage $V_{D11}$ applied to the digit line $D_{11}$ at the temperature of $-50°$ C., becomes lower than the voltage $V_{on1}$ at the temperature of 25° C.

Thus, the second embodiment has a temperature dependency of the write load characteristics similar to that of the first embodiment. Accordingly, the temperature dependency of the write voltage $V_D$ in the second embodiment is smaller than the conventional example.

In FIG. 1, MOSFETs $Q_{G3}$ and $Q_{G4}$ are E0-MOSFET, but can be NE-MOSFET. In addition, MOSFETs $Q_{G11}$ and $Q_{G12}$ are PE-MOSFET, but can be NE-MOSFET or E0-MOSFET having its gate and its drain connected in common. The number of series-connected MOSFETs is not limited. Further, the resistors $R_{11}$, $R_{12}$ and $R_{13}$ can be replaced with elements having a resistance component, for example, MOSFETs.

As mentioned above, in the semiconductor device in accordance with the present invention, when the semiconductor device is in the write mode, it is so controlled that the gate voltage of the write control MOSFET has a positive temperature characteristics. Therefore, even if the current drive power of the write control MOSFET is decreased because the temperature becomes higher than room temperature, the decrease of the current drive power of the write control MOSFET is compensated for by the increased gate voltage of the write control MOSFET. On the other hand, even if the current drive power of the write control MOSFET is increased because the temperature becomes lower than room temperature, and the increase of the current drive power of the write control MOSFET is compensated for by the decreased gate voltage of the write control MOSFET. Thus, the temperature dependency of the write voltage $V_D$ (the drain voltage of the memory cell) in the write mode can be made smaller than the conventional example. In other words, even if the temperature changes, the write voltage $V_D$ changes in a range near to a designed value, and therefore, even if the writing is performed at a high temperature, the writing time never becomes long. On the other hand, even if the writing is performed at a low temperature, the written memory cells are never erroneously erased. Accordingly, the temperature margin of the writing characteristics becomes larger than the conventional example.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory device comprising:

a plurality of digit lines;

a plurality of electrically programmable memory cells arranged in rows and columns, each of said plurality of electrically programmable memory cells arranged in said columns having a drain connected in common to an associated digit line, a plurality of X-address lines corresponding in number to a number of said rows, a gate of each of said plurality of electrically programmable memory cells in each of said rows being connected to a corresponding one of said plurality of X-address lines, a plurality of Y-address selection MOSFETs corresponding in number to a number of said columns, each of said Y-address MOSFETs having a source connected to a corresponding one of said digit lines and a gate connected to a corresponding Y-address line, a sense amplifier connected to a drain of each of said Y-address selection MOSFETs, a write control MOSFET having a source connected to said drain of each of said Y-address selection MOSFETs and a drain connected to a write voltage supplying terminal, a data input buffer connected to a data input terminal and having a high voltage receiving terminal so as to supply a high voltage to a gate of said write control MOSFET in accordance with a signal supplied to said data input terminal, and a write voltage setting circuit having an output connected to said high voltage receiving terminal of said data input buffer, wherein said write voltage setting circuit generates an output voltage, which is supplied to said gate of said write control MOSFET via said data input buffer, wherein a level of said output voltage is responsive to temperature changes to supply said plurality of electrically programmable memory cells with a substantially constant write voltage.

2. A semiconductor memory device comprising:

a plurality of digit lines;

a plurality of electrically programmable memory cells arranged in rows and columns, each of said plurality of electrically programmable memory cells arranged in said columns having a drain connected in common to an associated digit line, a plurality of X-address lines corresponding in number to a number of said rows, a gate of each of said plurality of electrically programmable memory cells in each of said rows being connected to a corresponding one of said plurality of X-address lines, a plurality of Y-address selection MOSFETs corresponding in number to a number of said columns, each of said Y-address MOSFETs having a source connected to a corresponding one of said digit lines and a gate connected to a corresponding Y-address line, a sense amplifier connected to a drain of each of said Y-address selection MOSFETs, a write control MOSFET having a source connected to said drain of each of said Y-address selection MOSFETs and a drain connected to a write voltage supplying terminal, a data input buffer connected to a data input terminal and having a high voltage receiving terminal so as to supply a high voltage to a gate of said write control MOSFET in accordance with a signal supplied to said data input terminal, and a write voltage setting circuit having an output connected to said high voltage receiving terminal of said data input buffer, said write voltage setting circuit being configured to generate an output voltage, having a positive temperature characteristic, supplied via said data input buffer to said gate of said write control MOSFET, wherein said write voltage setting circuit comprises:

a first partial circuit connected between said write voltage supplying terminal and ground, said first partial circuit having at least one MOSFET having a source connected to said write voltage supplying terminal and a gate and a drain connected in common to a first node, at least one MOSFET having a gate and a drain connected to a second node and a source connected to ground, at least two series-connected resistor means connected between said first node and said second node, a third node provided in said at least two series-connected resistor means for supplying a first voltage lower than a write voltage, said second node supplying a second voltage lower than said first voltage, and a second partial circuit connected between said write voltage supplying terminal and ground, said second partial circuit having a first MOSFET having a drain connected to said write voltage supplying terminal and a gate connected to said third node for receiving said first voltage, a source of said first MOSFET being connected to an output terminal of said write voltage setting circuit, and a second MOSFET having a drain connected to said output terminal of said write voltage setting circuit and a gate connected to said second node for receiving said second voltage, a source of said second MOSFET being connected to ground.

3. A semiconductor memory device comprising:

a plurality of digit lines;

a plurality of electrically programmable memory cells arranged in rows and columns, each of said plurality of electrically programmable memory cells arranged in said columns having a drain connected in common to an associated digit line, a plurality of X-address lines corresponding in number to a number of said rows, a gate of each of said plurality of electrically programmable memory cells in each of said rows being connected to a corresponding one of said plurality of X-address lines, a plurality of Y-address selection MOSFETs corresponding in number to a number of said columns, each of said Y-address MOSFETs having a source connected to a corresponding one of said digit lines and a gate connected to a corresponding Y-address line, a sense amplifier connected to a drain of each of said Y-address selection MOSFETs, a write control MOSFET having a source connected to said drain of each of said Y-address selection MOSFETs and a drain connected to a write voltage supplying terminal, a data input buffer connected to a data input terminal and having a high voltage receiving terminal so as to supply a high voltage to a gate of said write control MOSFET in accordance with a signal supplied to said data input terminal, and a write voltage setting circuit having an output connected to said high voltage receiving terminal of said data input buffer, said write voltage setting circuit being configured to generate an output voltage, having a positive temperature characteristic, supplied via said data input buffer to said gate of said write control MOSFET, wherein said write voltage setting circuit comprises:

a charge-pump circuit connected to said write voltage supplying terminal, a clamp means connected to an output of said charge-pump circuit for clamping an output voltage of said charge-pump circuit, said clamp means having a positive temperature characteristic, a first MOSFET having a drain connected to said write voltage supplying terminal and a gate connected to said output of said charge-pump circuit, a source of said first MOSFET being connected to an output terminal of said write voltage setting circuit, and a second MOSFET having a drain connected to said output terminal of said write voltage setting circuit and a gate connected to a constant voltage supplying output of a bias circuit node, a source of said second MOSFET being connected to ground.

4. A semiconductor memory device claimed in claim 3 wherein said clamp means is formed of a diode constituted of a P-type semiconductor substrate and an N-type diffusion layer formed in said P-type semiconductor substrate.

* * * * *

UNITED STATES PATENT AND TRADEMARK OFFICE
CERTIFICATE OF CORRECTION

PATENT NO. : 5,392,236
DATED : Feb. 21, 1995
INVENTOR(S) : HASHIMOTO

It is certified that error(s) appears in the above-identified patent and that said Letters Patent is hereby corrected as shown below:

Col. 3, line 20, delete "$Q_{w1}$" and insert --$Q_{W1}$--.

Col. 6, line 66, delete "$|(2\phi_{Fn})|\}\tfrac{1}{2}/C_{ox}$" and insert --$|(2\phi_{Fn})|\}^{1/2}/C_{ox}$--.

Col. 6, line 68, delete "$(2\phi_{Fp})\}\tfrac{1}{2}/C_{ox}$" and insert --$(2\phi_{Fp})\}^{1/2}/C_{ox}$--.

Signed and Sealed this

Thirteenth Day of June, 1995

Attest:

BRUCE LEHMAN

*Attesting Officer*    *Commissioner of Patents and Trademarks*